(12) United States Patent
Drussel et al.

(10) Patent No.: US 6,239,380 B1
(45) Date of Patent: May 29, 2001

(54) SINGULATION METHODS AND SUBSTRATES FOR USE WITH SAME

(75) Inventors: Zane Drussel; Derek Hinkle, both of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/382,304

(22) Filed: Aug. 24, 1999

Related U.S. Application Data

(62) Division of application No. 08/915,159, filed on Aug. 20, 1997, now Pat. No. 6,047,470.

(51) Int. Cl.[7] .................. H05K 1/00; H05K 3/02
(52) U.S. Cl. ............... 174/250; 174/250; 361/766; 361/719; 361/792; 428/901; 29/841; 29/846
(58) Field of Search .................. 174/250, 260, 174/261; 361/760, 79 E, 719, 777, 846; 29/841; 428/901

(56) References Cited

U.S. PATENT DOCUMENTS

| | | |
|---|---|---|
| 3,780,431 | 12/1973 | Feeney . |
| 4,316,320 | 2/1982 | Nogawa et al. . |
| 4,426,773 | 1/1984 | Hargis . |
| 4,532,839 | 8/1985 | Easton . |
| 4,621,552 | 11/1986 | Lopez . |
| 4,742,615 | 5/1988 | Lopez . |
| 4,791,721 | 12/1988 | Anderson et al. . |
| 4,926,546 * | 5/1990 | Polczynski et al. .............. 29/840 |
| 5,483,857 | 1/1996 | Ziberna . |
| 5,488,886 | 2/1996 | Mohr . |
| 5,652,185 * | 7/1997 | Lee ........................... 437/219 |
| 5,773,764 | 6/1998 | von Vajna . |
| 5,831,218 * | 11/1998 | Hu et al. ..................... 174/250 |
| 5,886,398 * | 3/1999 | Low et al. .................... 257/667 |
| 5,894,648 * | 4/1999 | Hill et al. .................... 29/33 P |
| 5,960,961 * | 10/1999 | Gutentag ...................... 206/714 |
| 6,114,189 * | 9/2000 | Chia et al. .................... 438/112 |

* cited by examiner

Primary Examiner—Albert W. Paladini
Assistant Examiner—I. B. Patel
(74) Attorney, Agent, or Firm—Mueting, Raasch & Gebhardt, P.A.

(57) ABSTRACT

A circuit board substrate assembly includes a generally planar circuit board substrate material having a longitudinal axis extending along a length of the substrate material between a first end and a second end thereof. The circuit board substrate material further has a first edge and a second edge extending along the length of the circuit board substrate material between the first end and the second end. A plurality of openings are defined in the substrate material. Each opening extends between a first distance from the first edge of the circuit board substrate and a second distance from the second edge of the circuit board substrate. Further, each opening separates adjacent circuit forming regions lying along the longitudinal axis and has first and second opposing end portions. The first end portions of each opening lie along a first singulation axis of the substrate material parallel to the longitudinal axis and the second end portions of each opening lie along a second singulation axis of the substrate material parallel to the longitudinal axis. Removing interconnect material along the first singulation axis and second singulation axis provide for singulation of the circuit forming regions and any circuits thereof.

5 Claims, 5 Drawing Sheets

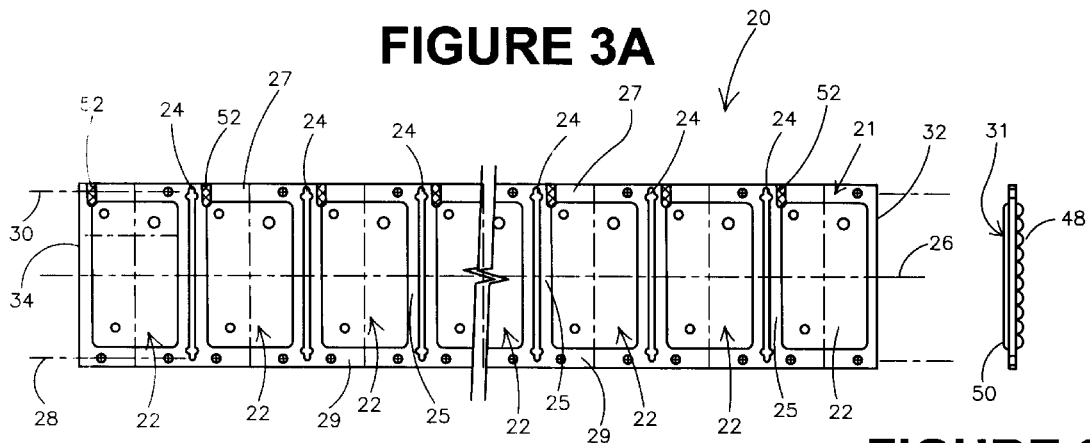
FIGURE 3A
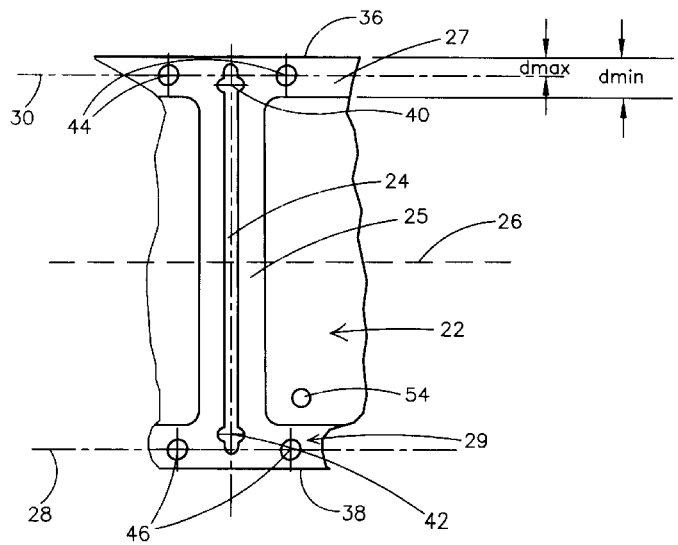
FIGURE 3B
FIGURE 3C

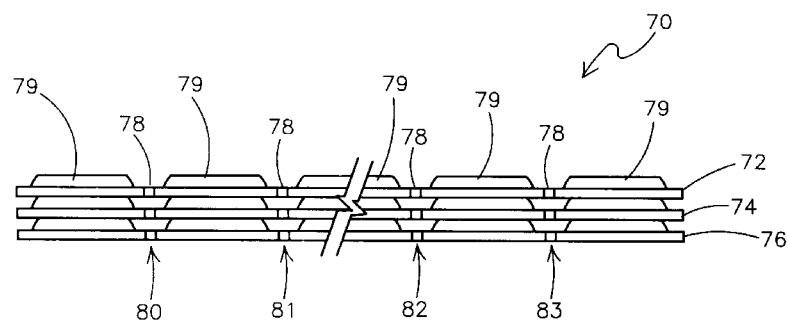
FIGURE 5
FIGURE 6
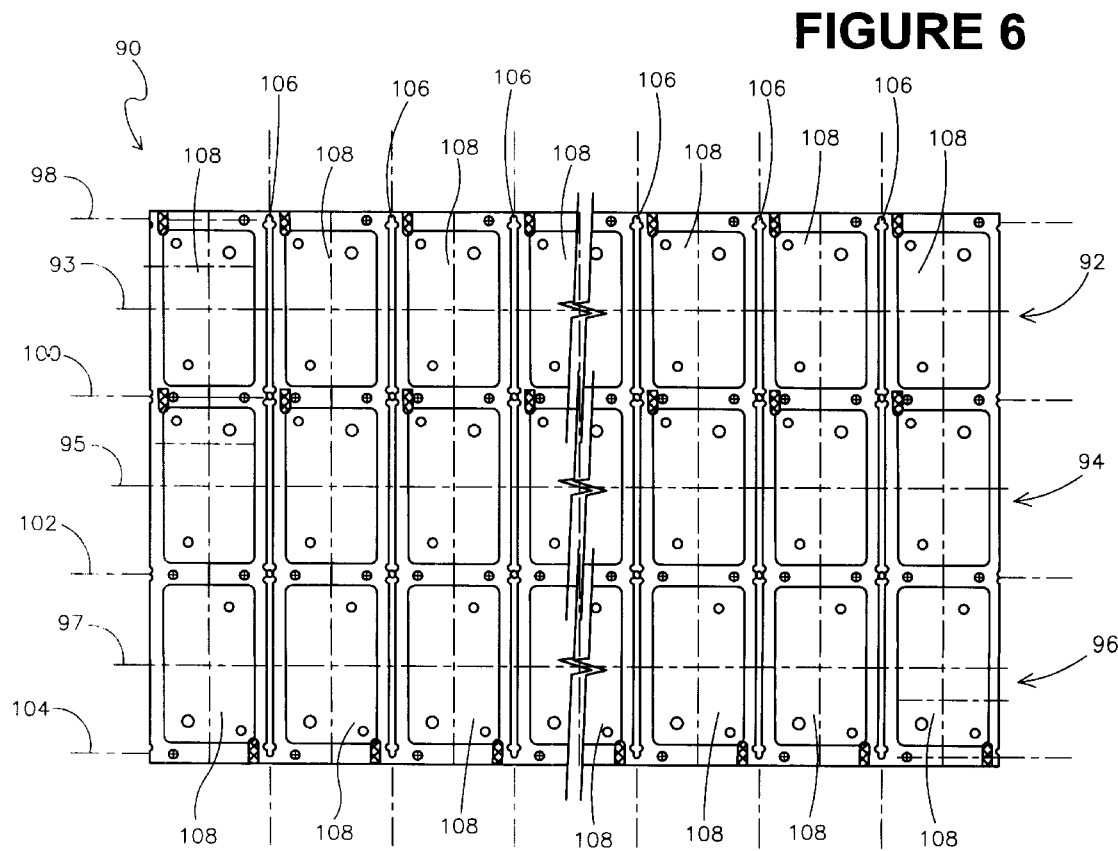

SINGULATION METHODS AND SUBSTRATES FOR USE WITH SAME

This is a division of application Ser. No. 08/915,159, filed Aug. 20, 1997, now U.S. Pat. No. 6,047,470, which is incorporated herein by reference.

FIELD OF THE INVENTION

The present invention relates to the singulation of circuit board substrate assemblies. Further, the present invention pertains to singulation methods and circuit board substrates for use with such singulation methods.

BACKGROUND OF THE INVENTION

Substantial savings of time and money have been realized in the industry by handling a plurality of printed circuit boards (PCB's) while they are still interconnected in a panel of substrate material. With use of interconnected PCB's, processing of such interconnected boards (e.g., populating the PCB's with components, wave soldering of the populated boards, quality control testing such as electrical function testing of whole boards or selected components, and/or encapsulating components populating interconnected PCB's) is more easily enabled. Particularly, such processing of interconnected PCB's is considered very advantageous in the automated processing demands of the electronics industry.

Methods presently used to separate, i.e., singulate, each separate or individual PCB from the interconnected PCB's in the panel of substrate material have typically included shearing, routing, break-away methods of routed tabs, scoring, perforation, and various punch and die techniques.

For example, routing may be performed to route slots in the panel around individual PCB's to define the perimeter of the individual boards. Typically, such routing leaves spaced support tabs around the perimeter for holding the individual boards in place. Such tabs are then cut, broken, or routed to singulate individual boards. Further, for example, scoring has been used for grooving lines along at least portions of individual board perimeters. Such score lines are then used to effect board separation by breaking along the score lines. In addition, various perforations have been used to define the perimeters of the individual boards. Breaking along the lines of perforation are then used for singulation of the individual boards. Punch and die methods of singulation have also been used wherein a custom made die is used to punch each individual board out of the substrate panel and then pulled back into the panel such that after the individual board is populated with components, the boards can be pushed from the panel. Punch and die methods have also been used to remove routed tabs.

The above methods, and various others, have many associated problems. For example, methods of preparing panels for subsequent break-away separation of the PCB's populated with components inherently rob the panel of its rigidity. Consequently, the panels are prone to sagging during wave soldering, excessive warping, and premature breakage prior to subsequent separation into the individual circuit boards. Perforation and scoring yield very poor quality edges. As such, such edges cannot be held to close tolerances. Further, punch and die methods require expensive tooling and cannot be used to process configurations of panels without scrap strips between adjacent individual circuit boards. Further, premature separation during handling of the interconnected circuit boards may occur with a number of the above singulation methods.

Although routing provides an advantageous singulation method, routing also has particular problems or disadvantages associated therewith. For example, excessive treatment by a router can be very expensive, particularly due to the cost of router bits and the time necessary to perform the routing process. For example, routing typically must be performed around the entire perimeter of the interconnected individual circuit boards, or at least along two or more axes (x, y). In addition, although tabs may be utilized to hold the individual circuit boards in place in the interconnected panel of substrate material, the tabs are typically along two different axes of the individual circuit board, requiring the routing tool to be used along at least two different axes to singulate the individual circuit boards. Further, routing of tabs may still result in remaining tab stubs which may require a secondary procedure for removing such stubs from the individual circuit boards.

Various references describe singulation systems. For example, U.S. Pat. No. 4,791,721 describes a singulation system where individual portions of PCB's are interconnected by small break-away tabs so that the individual circuit boards populated with components can be separated without damaging the components assembled on a board. This singulation system uses a punch technique where a punch or die comes into contact with the printed circuit board and punches out the interconnecting portions, i.e., tabs. Other systems use a combination of routing and shearing such as described in U.S. Pat. No. 4,742,615.

Although there are various conventional methods utilized for singulation of interconnected PCB's, there is a need in the art for other advantageous methods for performing such singulation. Further, there is a need for substrates for utilization with such methods which provide such advantages. The present invention provides a singulation method and substrate for use in singulation methods which overcome the disadvantages described above along with other problems as will be apparent from the description below.

SUMMARY OF THE INVENTION

A singulation method according to the present invention includes providing a generally planar circuit board substrate assembly having a longitudinal axis extending between a first end and a second end. The circuit board substrate assembly further includes a plurality of circuit board portions lying along the longitudinal axis with at least two of the plurality of circuit board portions separated by an opening and connected by interconnect material. Interconnect material along a first singulation axis and a second singulation axis extending substantially parallel to the longitudinal axis is removed to singulate at least two circuit board portions. The first singulation axis and the second singulation axis intersecting with respective first and second portions of the opening.

In another singulation method, the method includes providing a circuit board substrate assembly having a longitudinal axis extending between a first end and a second end of the circuit board substrate assembly. The circuit board substrate assembly includes a plurality of openings positioned along the longitudinal axis with each of the plurality of openings separating two regions of a plurality of circuit forming regions connected by interconnect material. Circuit portions are formed in one or more of the circuit forming regions. Interconnect material is removed along a first singulation axis and a second singulation axis extending substantially parallel to the longitudinal axis. The first singulation axis and the second singulation axis intersect with respective first and second open portions of each of the openings such that when the material is removed each of the plurality of circuit forming regions are singulated.

In yet another singulation method according to the present invention, an elongate circuit board substrate assembly having a longitudinal axis extending along a length of the circuit board substrate between a first end and a second end thereof is provided. The circuit board substrate assembly further has a first edge and a second edge extending along the length of the circuit board substrate assembly between the first and second end. A plurality of formed circuit portions are provided along the longitudinal axis of the elongate circuit board substrate assembly with each of the plurality of formed circuit portions having a perimeter located at least a minimum distance from each of the first edge and second edge of the circuit board substrate assembly. Each pair of adjacent formed circuit portions of the plurality of formed circuit portions are separated by an opening with the opening extending between a position located less than a maximum distance from each of the first edge and second edge of the circuit board substrate assembly. The minimum distance is greater than the maximum distance. Interconnect material along a first singulation axis and a second singulation axis at each of the first and second edges of the circuit board substrate extending substantially parallel to the longitudinal axis is removed. The first singulation axis and the second singulation axis intersect with first and second open portions of each of the openings such that when the interconnect material is removed the plurality of formed circuit portions are singulated.

In one embodiment of the methods, each opening is a single slot extending generally perpendicular to the longitudinal axis between adjacent circuit forming regions.

In another embodiment of the methods, the circuit board substrate assembly includes a matrix of circuit board portions, the matrix of circuit board portions are singulated in a manner similar to the methods described above.

A circuit board substrate assembly according to the present invention includes a generally planar circuit board substrate material having a longitudinal axis extending along a length of the substrate material between a first end and a second end thereof. The circuit board substrate material further has a first edge and a second edge extending along the length of the circuit board substrate material between the first end and the second end. A plurality of openings are defined in the substrate material. Each opening extends between a first distance from the first edge of the circuit board substrate material and a second distance from the second edge of the circuit board substrate material. Further, each opening separates adjacent circuit forming regions lying along the longitudinal axis and has first and second opposing end portions. The first end portions of each opening lie along a first singulation axis of the substrate material parallel to the longitudinal axis and the second end portions of each opening lie along a second singulation axis of the substrate material parallel to the longitudinal axis.

BRIEF DESCRIPTION OF THE DRAWINGS

FIG. 3A is a top view of the circuit board substrate assembly as shown in FIG. 1.

FIG. 3B is a side view of the circuit board substrate assembly shown in FIG. 3A.

FIG. 3C is a detail view of a slot between interconnected individual circuit board portions of the circuit board substrate assembly of FIG. 3A.

FIG. 5 is a plurality of circuit board substrate assemblies stacked for singulation in accordance with the present invention.

FIG. 6 is a circuit board substrate assembly including a matrix of individual circuit board portions in accordance with the present invention.

DETAILED DESCRIPTION OF THE EMBODIMENTS

The present invention shall be generally described with reference to FIGS. 1–4. With the description as provided below, it should be readily apparent to one skilled in the art that the various processes and structures described with reference to the Figures may be used in various combinations and configurations. Further, it should be apparent that the scaling in the Figures does not represent precise dimensions of the various elements illustrated therein.

In this application, "circuit board substrate assembly " refers to any of the following including, but not limited to, printed circuit board substrate material, a circuit board substrate material populated with components, a circuit board substrate material having elements defined therein (e.g., openings, slots, markers, alignment holes, etc.), a circuit board substrate material having encapsulated circuitry defined in various regions of the substrate material, circuit board substrate material having various interconnection patterns and interconnection materials, or any other circuit board substrate material having various layers formed thereon, various circuit components mounted thereon, various openings or depressions or projections defined therein or extending therefrom, or any combination of the foregoing or other similar structures.

Further, in this application, circuit board substrate material as used herein refers to any type of circuit board substrate material including, but not limited to, fiberglass, FR4, BT resin, or any other substrate materials utilized as known to one skilled in the art in the formation of printed circuit boards, such as any routable material.

Yet, further, whenever utilized herein, "components " or "contents of a circuit " shall refer to any structural element including electrical, mechanical, resistive, inductive, capacitive, integrated circuit, metallization, leads, or any other structural element or material formed relative to the substrate material typically utilized in producing circuitry on a circuit board. Such components may include, but are clearly not limited to, surface mount components, dual in-line packaged components, chip carriers, capacitive, inductive, or resistive components, metallization for electrical connection such as leads, printed writing, etc.

It should be readily apparent to one skilled in the art that whenever reference is made to a circuit board substrate assembly in the following description, various process steps may have been previously utilized to form individual circuits on a particular circuit board substrate material. For example, such processing steps include mounting steps, molding steps for encapsulating material over circuit components, curing steps, metallization steps, etc.

Figure 1:
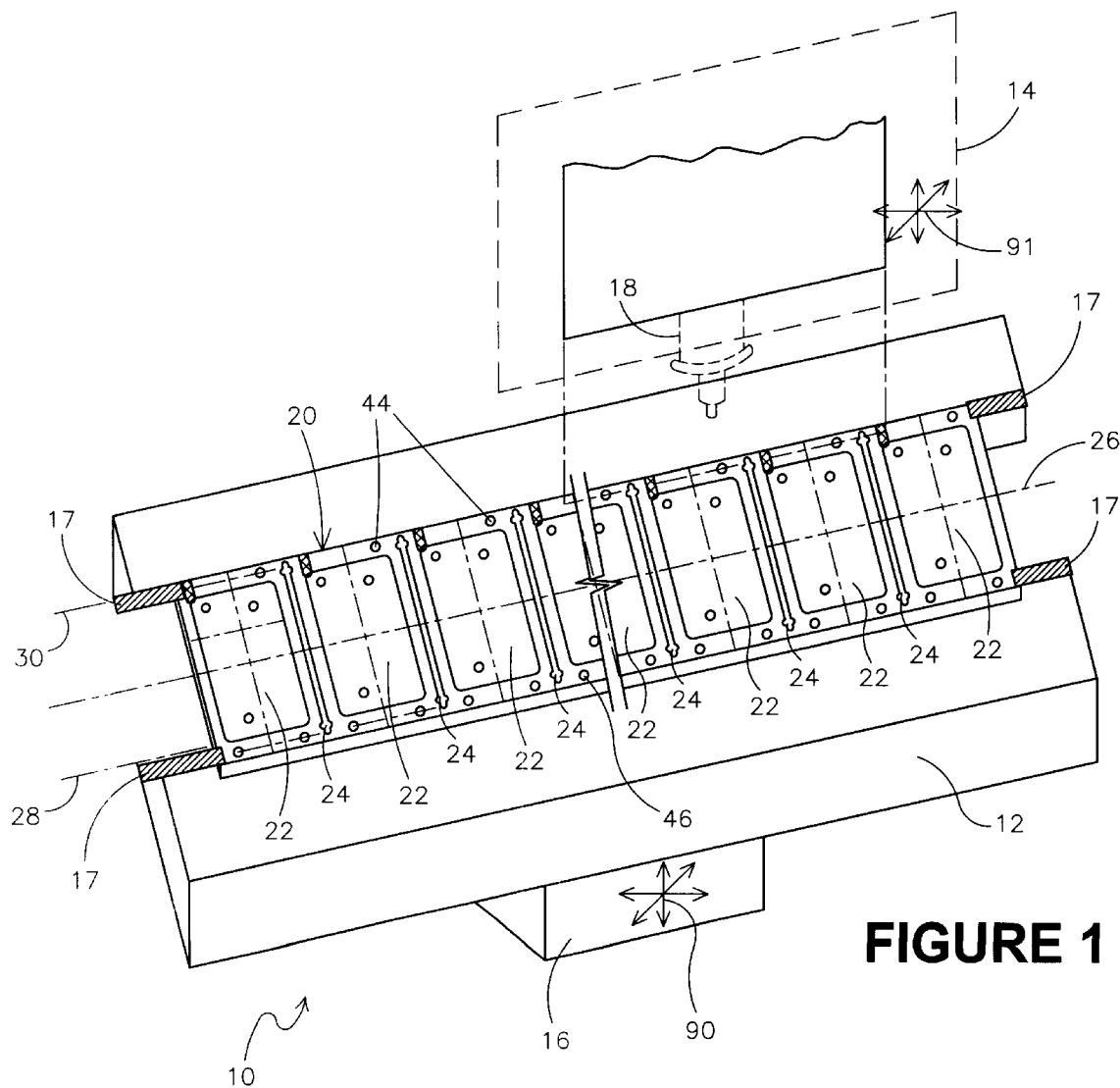
FIG. 1 is an illustration of a singulation system in accordance with the present invention.

FIG. 1 shows a general illustrative singulation system 10 in accordance with the present invention. Generally, singulation system 10 includes a mainframe holding apparatus 12, a material removal tool 14, e.g., a router 18, and a circuit board substrate assembly 20 including a plurality of interconnected individual circuit board portions 22. Mainframe holding apparatus 12 includes a number of clamping members 17 for holding and orientating the circuit board substrate assembly 20 in position during singulation. Further, mainframe holding apparatus 12 may include a motor driven apparatus 16 for moving the mainframe holding apparatus 12 along an x, y, or z direction as represented generally by arrows 90. It should be readily apparent to one skilled in the art that the mainframe holding apparatus 12 will vary depending upon the circuit board substrate assembly being singulated. For example, various operations may occur at the back side of the circuit board substrate assembly requiring an opening beneath the circuit board substrate assembly. Further, for example, if the singulation procedure involves a scoring operation, such an opening beneath the circuit board substrate assembly may not be required.

The material removal tool 14 may be any one of a number of singulation tools available in the current art as represented generally by dashed box 14. For example, the material removal tool 14 may be a scorer for producing score lines where desired and the means for breaking material away along the score lines as known by one skilled in the art. Further, the material removal tool 14 may be a shearing blade for producing the shearing action along a line as desired. In other embodiments of the present invention, the material removal tool 14 may be a perforation tool for providing a line of perforations along an axis, and further wherein material may be removed by performing a breaking operation along such lines of perforation. It should be recognized that any particular material removal tool 14 capable of removing material along a single axis as described herein may be utilized in accordance with the present invention.

Preferably, the material removal tool 14 is a numerically controlled router 18. For example, such numerically controlled routers are known to those skilled in the art and conventionally available. Any suitable numerically controlled router capable of routing along an axis in accordance with the present invention is contemplated in accordance with the scope of the accompanying claims. For example, such a numerically controlled router 18 may be a router sold under the trade designation of TR1000 available from Cencorp, a router sold under the trade designation of EX110 available from Excellon Automation Co., etc. It will be readily apparent that the numerically controlled router may be moved in any x, y, or z direction as represented by arrows 91. However, in accordance with the present invention, the material removal tool 14 need only remove material along a single axis, e.g., singulation axes 28 and 30 which are peripheral axes spaced a predetermined distance from longitudinal axis 26.

Figure 2:
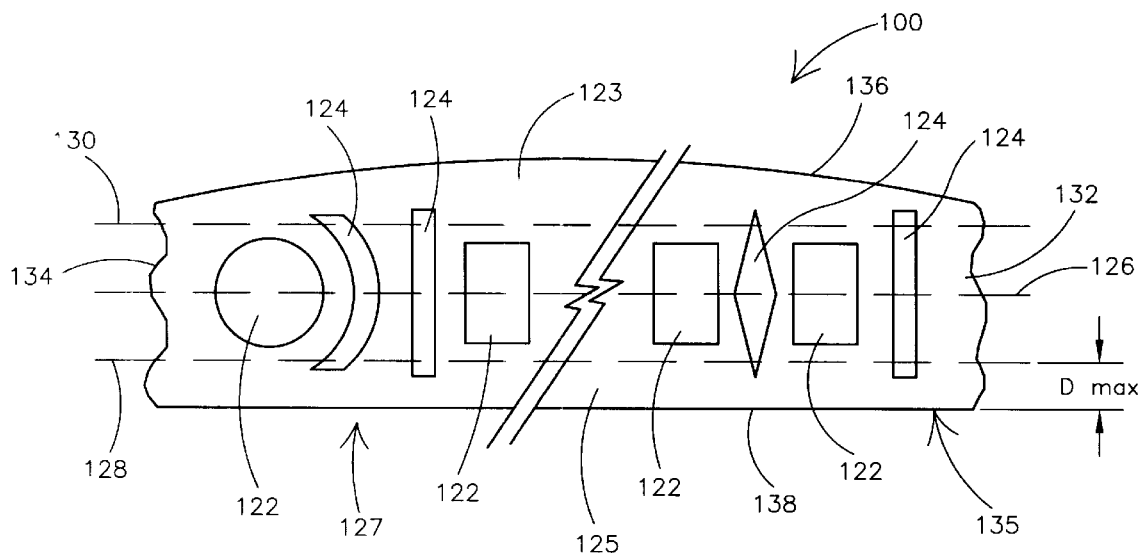
FIG. 2 is a top view of an illustrative circuit board substrate assembly showing various alternate embodiments of a substrate assembly in accordance with the present invention.
Figure 3D:
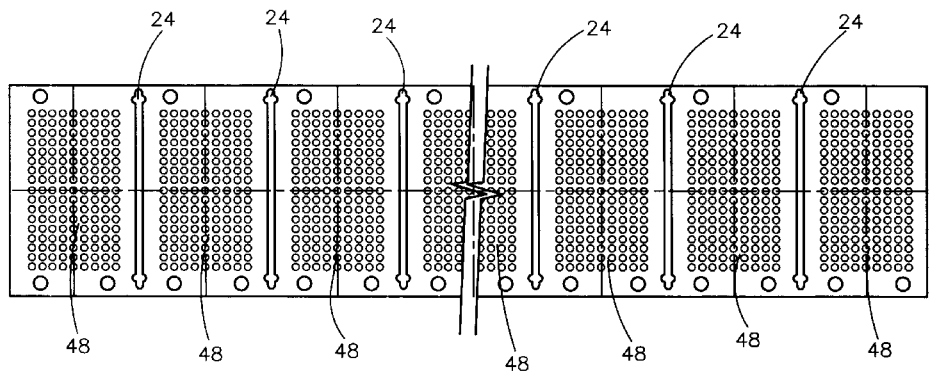
FIG. 3D is a bottom view of the circuit board substrate assembly shown in FIG. 3A.
Figures 4A, 4B, 4C:
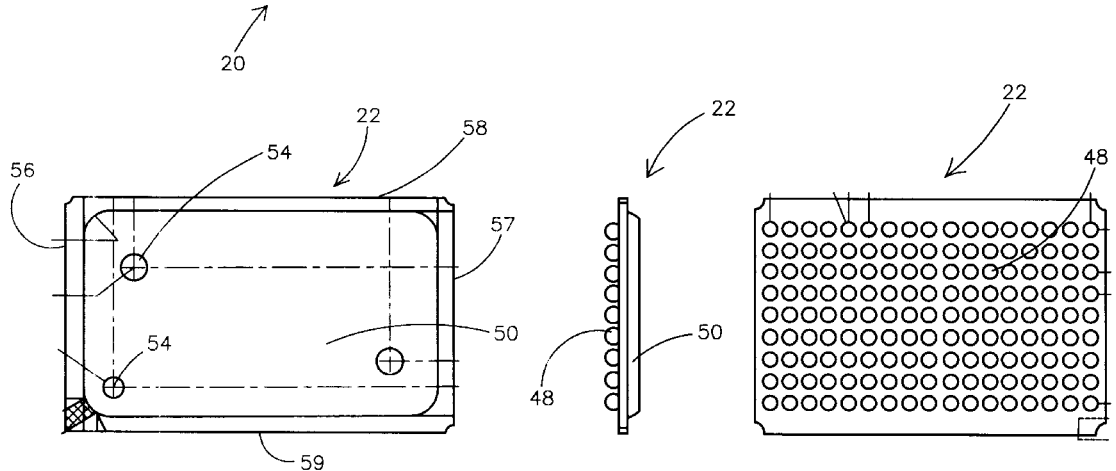
FIG. 4A is a singulated individual circuit board portion of the circuit board substrate assembly shown in FIGS. 3A–3D.
FIG. 4B is a side view of the individual circuit board portion shown in FIG. 4A.
FIG. 4C is a bottom view of the individual circuit board portion shown in FIG. 4A.

Although the circuit board substrate assembly 20 is shown in a particular configuration in FIG. 1, which is further described in detail with respect to FIG. 3 (FIGS. 3A–3D) and 4 (FIGS. 4A–4C), the circuit board substrate assembly 20 is shown in more general form in FIG. 2. As shown in FIG. 2, a circuit board substrate assembly 100 may include any number of interconnected individual circuit board portions 122 lying along a longitudinal axis 126 of the circuit board substrate assembly 100 formed relative to substrate material 135. The individual circuit board portions 122 are interconnected by respective portions of peripheral substrate material 123 and 125 which extend between a first end 132 and a second end 134 of the circuit board substrate assembly 100. Generally, the individual circuit board portions 122 may be of any size and shape as desired. The individual circuit board portions 122 are located inward from the respective edges 136 and 138 of the circuit board substrate assembly 100. Further, the individual circuit board portions 122 are separated from other circuit board portions 122 by at least one opening 124 which is defined adjacent individual circuit portions 122 a predetermined distance respectively inward from both edges 136 and 138.

Generally, the openings 124 may be of any size or shape as desired. The openings are defined a maximum distance ($d_{max}$) from the respective edges 136 and 138 of the circuit board substrate assembly 100 dependent at least in part on the size, shape, and position of the individual circuit board portions 122. The singulation axes 130 and 128 intersect opposing ends of each of the openings 124 defined for separating the individual circuit board portions 122. The distance ($d_{max}$) at each edge is always less than the distance of the periphery of the individual circuit board portions 122 from the respective edges. It should be apparent to one skilled in the art that multiple openings 124 may be defined between adjacent circuit portions, as shown generally at reference number 127. Further, it should be readily apparent that such openings may take the form of a slot which is substantially perpendicular to longitudinal axis 126 or may take any arcuate, angular, or other size and shape as generally shown by multiple opening configurations in FIG. 2, e.g., arcuate, diamond, etc.

Also, as shown in FIG. 2, one skilled in the art will recognize that the circuit board substrate material 135 may include any number of circuit board portions 122 defined or formed thereon. Further, the peripheral material interconnecting the various circuit board portions may have an edge that is not parallel to the longitudinal axis 126 as is generally represented by edge 136. However, as one skilled in the art will recognize, having additional unnecessary material produces an excess amount of waste. Therefore, to minimize the interconnect material, such edges are parallel to axis 126. Further, as one skilled in the art will recognize from the detailed description of the preferred embodiment below, the openings 124 are preferably slots lying perpendicular to the longitudinal axis 126 with rectangular-sized circuit portions 122 lying adjacent such slot openings 124. As such, waste is again eliminated in that further trimming of the circuit board portions 122 is minimized after the individual circuit portions 122 are singulated from the circuit board substrate assembly 100.

A preferred embodiment of a substrate assembly is shown in FIGS. 1 and 3–4. As shown in FIGS. 3A and 3B, circuit board substrate assembly 20 includes a generally planar and rectangular shaped panel or strip of substrate material 21. The strip of substrate material 21 includes a longitudinal axis 26 extending between a first end 32 and a second end 34 of the circuit board substrate material 21. The circuit board substrate material 21 further includes a first edge 36 extending on one side of the substrate material 21 between the first end 32 to the second end 34 and a second edge 38 extending between the first end 32 to the second end 34 of the substrate material 21.

The substrate material 21 can be separated into three distinctive types of regions. First, a plurality of circuit forming regions 25 lie along a length of the circuit board substrate material 21 along the longitudinal axis 26. Circuit forming regions 25 are for use in the formation of circuit portions 31 of the individual circuit board portions 22. Each of the circuit forming regions 25 is generally of rectangular shape and has a defined perimeter. Separating each of the plurality of circuit board forming regions 25 from one another are openings 24 defined in the circuit board substrate material 21. The openings 24 are of a slot-like configuration generally lying perpendicular to the longitudinal axis 26. Interconnecting the circuit forming regions 25 adjacent each respective edge 36 and 38 are interconnection material regions 27 and 29. Such interconnection regions 27 and 29 provide support for the circuit forming regions 25 adjacent the openings 24.

FIGS. 3A and 3B show a plurality of encapsulated circuit portions 31 formed in the circuit forming regions 25 of the circuit board substrate material 21 resulting in the interconnected individual circuit board portions 22. As an illustration of a circuit portion 31 which can be formed relative to the substrate material 21, FIGS. 3 and 4 show a bump grid array package outline which includes bumps 48 on the bottom side of the circuit board substrate assembly 20 (FIG. 3D) and an encapsulated or molded package portion 50 formed on the side of the circuit board substrate material 21 opposite of ball grid array bumps 48. As would be readily known to one skilled in the art, the ball grid array bumps 48 are connected to circuit components encapsulated by the molding material 50 by interconnection circuitry to form a complete encapsulated circuit 31.

The perimeter of the individual circuit board portions 22, including encapsulated circuit portion 31 formed in the circuit forming regions 25 of substrate material 21, is defined by the openings 24 adjacent the circuit board portions and the singulation axes 28 and 30. The singulation axes 28 and 30 lie in parallel relationship to longitudinal axis 26 of the circuit board substrate material 21, e.g., the singulation axes 28, 30 and longitudinal axis 26 all lie in the x direction with each of the singulation axes 28, 30 spaced a distance from the longitudinal axis 26.

As shown in more detail in FIG. 3C, the elongated slot-like opening 24 extends from a position inward of the edge 36 of circuit board substrate material 21 to a position inward of edge 38 of circuit board substrate material 21. The distance of the opening relative to the edge 36 and edge 38 may vary but is shown as $d_{max}$ in FIG. 3C. The distance $d_{max}$ depends upon the distance $d_{min}$, i.e., the minimum distance the formed circuit portion 31 is from the respective edges 36 and 38. It will be readily apparent to one skilled in the art that the distance $d_{max}$ will always be less than the distance $d_{min}$. Further, it should be apparent that the respective distances at either edges 36, 38 may vary, but that $d_{max}$ is always less than $d_{min}$, e.g., $d_{max}$ may be different at edge 36 than at edge 38.

As shown in FIG. 3A, and in further detail in FIG. 3C, the singulation axis 28 passes through a first end opening portion 42 of opening 24 of each of the openings 24 separating the plurality of individual circuit board portions 22. Further, singulation axis 30 intersects with a second end opening portion 40 of each elongated opening 24. First end opening portion 42 and second end opening portion 40 are in opposing relation to one another inward of respective edges 38 and 36. With the singulation axis 30 intersecting end portions 40 of each opening 24 and with singulation axis 28 intersecting each open end portion 42 of opening 24, removal of material along the respective singulation axes 28, 30 (i.e., interconnect regions 27, 29 of substrate material 21 lying at edges 36, 38) results in singulation of the circuit board substrate assembly 20 into respective individual circuit board portions 22. The removal of at least a portion of the interconnect substrate material 27, 29 between the openings 24 which separate adjacent pairs of individual circuit board portions 22 result in the plurality of singulated individual circuit board portions 22.

The singulated individual circuit board portions 22 are shown in detail in FIGS. 4A–4C. In FIG. 4A, the individual circuit board portions 22 include singulated edge 56 and singulated edge 57 on opposing ends of circuit board portion 22. Extending between singulation edges 56, 57 are opening edges 58, 59. FIG. 4B shows a side view of the individual circuit board portions 22 including molded encapsulating material 50 and ball grid array bumps 48. Further, the underside, i.e., ball grid array bumps 48 of the individual circuit board portion 22, are shown in FIG. 4C.

The removal of the interconnect substrate material 27, 29 along the singulation axes 28, 30 may be performed by any suitable removal tool 14 as previously described. Preferably, the removal is performed by moving a tool, e.g., router 18, along a single direction (i.e., unidirectional). However, it will be recognized by one skilled in the art that movement of the substrate material relative to a singulation tool may also be used to perform the removal of interconnect material, e.g., movement provided by motor driven apparatus 16 (FIG. 1).

Various other features of the circuit board substrate assembly 20 are shown in FIGS. 1, 3, and 4. For example, injection regions 52 are shown which facilitate molding or encapsulating circuit components or other contents populating circuit forming regions 25. For example, such injection regions 52, i.e., injection gate regions, may be formed of metal materials, such as gold, so that encapsulation materials will not stick to such regions.

Also shown in such Figures are various alignment holes 44, 46 for aligning the circuit board substrate assembly 20 for various process techniques to be performed relative to the substrate material 21, as would be known to one skilled in the art. Further, such alignment holes may be utilized for orientating the circuit board substrate assembly 20 relative to material removal tool 14 for removal of interconnect material as previously described. Further, identification marks 54 are shown in the encapsulating or molding material 50 for pin or lead identification purposes during later processing.

The openings 24 defined in the circuit board substrate material 21 may be provided by one of various processes. Such processing or definition of the openings 24 are provided prior to the processing steps utilized in forming the encapsulated circuit portion 31 relative in the circuit forming regions 25 of the circuit board substrate material 21. For example, the openings 24 may be defined in the circuit board substrate material 21 by molding during the formation of the circuit board substrate material 21 or may be defined therein after the substrate material is formed. For example, the openings may be routed, punched, laser cut, water jet cut, etc. Having the openings 24 formed prior to processing of the panel of substrate material 21, e.g., soldering, encapsulating, etc., reduces the amount of routing necessary to singulate after circuit portions have been formed. Excessive routing results in various problems as previously described.

As shown in FIG. 5, a stack 70 of circuit board substrate assemblies 72, 74, 76 may be singulated at the same time. For example, each of the circuit board substrate assemblies 72, 74, 76 include circuit board portions 79 and openings 70 of like size and orientation. For example, the openings 78 of the circuit board substrate assemblies 72, 74, 76 are aligned in columns as shown by reference numbers 80–83. Stack 70 may be singulated by a material removal tool having sufficient depth to remove material from the entire stack 70 of circuit board substrate assemblies 72, 74, 76 along the singulation axes like those shown and described above.

Further, as shown in FIG. 6, singulation may be performed on a circuit board substrate assembly 90 including a matrix of individual circuit board portions 108 separated by openings 106. As shown in FIG. 6, the circuit board portions 108 lie along a corresponding axis of a row of circuit board portions. For example, a plurality of circuit board portions 108 lie along longitudinal axis 93 of row 92, a plurality of circuit board portions 108 lie along a longitudinal axis 95 of row 94, and a plurality of circuit board portions 108 lie along a longitudinal axis 97 of row 96. Rows 92 and 94 are separated by a singulation axis 100 defined therebetween which intersects with openings 106 separating the individual circuit portions 108 lying in rows 92 and 94. Likewise, a singulation axis 102 is defined between rows 94 and 96. With singulation along singulation axes 100, 102 and, further, with removal of interconnect material along axes 98, 104, each of the plurality of circuit board portions 108 is singulated from the whole of the circuit board substrate assembly 90.

All patents or other references cited herein are incorporated in their entirety as if each were incorporated separately. Where this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the scope of the present: invention as defined by the accompanying claims.

What is claimed is:

1. A circuit board substrate assembly comprising:

a generally planar circuit board substrate material having a longitudinal axis extending along a length of the substrate material between a first end and a second end thereof, the circuit board substrate material further having a first edge and a second edge extending along the length of the circuit board substrate material between the first end and the second end; and a plurality of openings defined in the substrate material, each opening extending between a first distance from the first edge of the circuit board substrate and a second distance from the second edge of the circuit board substrate, each opening separating adjacent circuit forming regions lying along the longitudinal axis, and further wherein each opening has a first and second opposing end portion with the first end portions of each opening lying along a first singulation axis of the substrate material parallel to the longitudinal axis and the second end portions of each opening lying along a second singulation axis of the substrate material parallel to the longitudinal axis.

2. The assembly of claim 1, wherein the circuit board substrate material is of a generally rectangular configuration and each opening is a single slot extending generally perpendicular to the longitudinal axis between the adjacent circuit forming regions.

3. The assembly of claim 1, further comprising one or more circuits formed in the circuit forming regions of the substrate material resulting in a plurality of individual circuit board portions wherein a perimeter of each of the plurality of individual circuit board portions located at least a minimum distance from each of the first and second edges of the circuit board substrate material, the minimum distance being greater than the first and second distances.

4. The assembly of claim 3, wherein one or more circuits include ball grid array configurations.

5. The assembly of claim 3, wherein one or more circuits include surface mount component configurations.

* * * * *